(12) United States Patent
Machler et al.

(10) Patent No.: US 10,600,721 B2
(45) Date of Patent: Mar. 24, 2020

(54) HEAT EXCHANGER FOR DUAL-SIDED COOLING OF ELECTRONIC MODULES

(71) Applicant: Dana Canada Corporation, Oakville (CA)

(72) Inventors: Meinrad K. A. Machler, Oakville (CA); Colin A. Shore, Hamilton (CA); Dale L. Bartnik, Mississauga (CA)

(73) Assignee: Dana Canada Corporation, Ontario (CA)

(*) Notice: Subject to any disclaimer, the term of this patent is extended or adjusted under 35 U.S.C. 154(b) by 142 days.

(21) Appl. No.: 15/840,504

(22) Filed: Dec. 13, 2017

(65) Prior Publication Data

US 2018/0166357 A1    Jun. 14, 2018

Related U.S. Application Data

(60) Provisional application No. 62/433,936, filed on Dec. 14, 2016.

(30) Foreign Application Priority Data

Jul. 21, 2017    (CN) .......................... 2017 1 0600887

(51) Int. Cl.
*H01L 23/40* (2006.01)
*F28D 1/03* (2006.01)
(Continued)

(52) U.S. Cl.
CPC ........ *H01L 23/4006* (2013.01); *F28D 1/0325* (2013.01); *F28F 3/12* (2013.01); *F28F 13/00* (2013.01); *H01L 23/40* (2013.01); *H01L 23/467* (2013.01); *H01L 23/473* (2013.01); *H01L 25/07* (2013.01); *H01L 25/072* (2013.01); *H01L 25/11* (2013.01); *H05K 7/209* (2013.01); *H05K 7/20927* (2013.01); *F28D 2021/0029* (2013.01);
(Continued)

(58) Field of Classification Search
None
See application file for complete search history.

(56) References Cited

U.S. PATENT DOCUMENTS

5,306,065 A * 4/1994 Ades .................... B60J 3/0208
                                                    296/97.6
5,426,565 A    6/1995 Anderson
(Continued)

*Primary Examiner* — Anthony Ho
*Assistant Examiner* — Kevin Quinto
(74) *Attorney, Agent, or Firm* — McCoy Russell LLP (57) ABSTRACT

A heat exchanger assembly has first and second heat sink elements enclosing fluid flow passages, and a clamping assembly. The heat sink elements are separated by a space in which at least one heat-generating electronic component is located, with outer side surfaces of each electronic component being in thermal contact with the heat sink elements. The clamping assembly has first and second spring elements arranged in contact with an outer surfaces of the heat sink elements. The spring elements are joined together to apply compressive forces to the heat sink elements and to cause the electronic components to be clamped between the heat sink elements. Each spring element has discrete force application regions for applying force to a heat sink element, and a plurality of fastening regions for compressing and maintaining the positions of the spring elements relative to the outer surfaces of the heat sink elements.

23 Claims, 10 Drawing Sheets

(51) Int. Cl.

| | |
|---|---|
| *F28F 3/12* | (2006.01) |
| *H01L 25/11* | (2006.01) |
| *H01L 25/07* | (2006.01) |
| *F28F 13/00* | (2006.01) |
| *H01L 23/467* | (2006.01) |
| *H01L 23/473* | (2006.01) |
| *H05K 7/20* | (2006.01) |
| *F28D 21/00* | (2006.01) |

(52) U.S. Cl.
CPC ..... *F28F 2275/08* (2013.01); *H01L 2023/405* (2013.01); *H01L 2023/4081* (2013.01); *H01L 2023/4087* (2013.01)

(56) References Cited

U.S. PATENT DOCUMENTS

| | | |
|---|---|---|
| 5,672,920 A | 9/1997 | Donegan et al. |
| RE35,890 E | 9/1998 | So |
| 6,181,556 B1 * | 1/2001 | Allman ............... G06F 1/20 165/185 |
| 6,273,183 B1 | 8/2001 | So et al. |
| 7,295,433 B2 | 11/2007 | Taylor et al. |
| 8,541,875 B2 | 9/2013 | Bennion et al. |
| 9,041,183 B2 | 5/2015 | Liang et al. |
| 9,443,787 B2 | 9/2016 | Otremba et al. |
| 2015/0171578 A1 | 6/2015 | Taylor et al. |

\* cited by examiner

HEAT EXCHANGER FOR DUAL-SIDED COOLING OF ELECTRONIC MODULES

CROSS-REFERENCE TO RELATED APPLICATION

This application claims priority to and the benefit of U.S. Provisional Patent Application No. 62/433,936 filed Dec. 14, 2016, and Chinese Patent Application No. 201710600887.1 filed Jul. 21, 2017, the contents of which are incorporated herein by reference.

FIELD

The present disclosure relates to heat exchangers having a pair of heat sinks for cooling the opposite sides of an electronics package including a plurality of heat-generating electronic components.

BACKGROUND

Electric vehicles ("EV") and hybrid electric vehicles ("HEV") employ power electronics devices which generate significant amounts of heat energy. This heat energy must be dissipated to avoid excessive heating of these devices, which could lead to damage or reduced performance.

Automotive power electronics devices typically include one or more heat-generating electronic components such as transistors, resistors, capacitors, field effect transistors (FETS), isolated gate bipolar transistors (IGBTs), power inverters, DC to DC converters and DC to AC converters.

Although the structure of automotive power electronics devices is variable, the power electronic devices in some applications are provided with opposite planar faces along which cooling can be effected. IGBTs are an example of power electronic devices which may have this structure. Such devices can be cooled by contacting one or both of the opposite planar faces of the device with a heat sink. In order to maximize thermal contact with the planar face of the power electronic device, the heat sink has a planar surface along which it contacts the power electronic device, and a thin layer of thermal interface material (TIM) may be provided between the heat sink and the planar face of the power electronic device. To enhance heat transfer, a cooling fluid such as air or a liquid coolant may be circulated along or through the heat sink.

Known cooling arrangements for power electronics devices may include means for clamping first and second heat sink devices to the opposite sides of a power electronics package in a sandwich arrangement, in order to improve thermal contact between the electronics devices and the heat sinks. An electronics assembly having first and second heat sink devices positioned in thermal communication with the first and second side surfaces of an electronics package is disclosed in U.S. Pat. No. 7,295,433 B2 to Taylor et al. The electronics assembly disclosed by Taylor et al. is held together by a pair of fastened together clamps, each having a shape configured to engage or receive the periphery of one of the heat sink devices.

There remains a need for simple and effective heat exchangers for dual-sided cooling of heat-generating electronic components, whereby effective thermal communication is provided between the heat sinks and opposite side surfaces of the electronics components.

SUMMARY

In an embodiment, there is provided a heat exchanger assembly comprising: a first heat sink element and a second heat sink element separated by a space, wherein the first heat sink element defines a first fluid flow passage and the second heat sink element defines a second fluid flow passage, and wherein the first and second heat sink elements are parallel to one another; at least one heat-generating electronic component located in said space and sandwiched between the first and second heat sink elements, wherein each said heat-generating electronic component has a first side surface in thermal contact with an inner surface of the first heat sink element and an opposite side surface in thermal contact with the inner surface of the second heat sink element; and a clamping assembly, comprising: (a) a first spring element arranged in contact with an outer surface of the first heat sink element; and (b) a second spring element arranged in contact with an outer surface of the second heat sink element; wherein the first and second heat sink elements are sandwiched between the first and second spring elements, and wherein the first and second spring elements are joined together so as to apply compressive forces to the first and second heat sink elements and thereby cause the at least one heat-generating electronic component to be clamped between the first and second heat sink elements.

In an embodiment, each said spring element comprises one or more discrete force application regions for applying force to one of the heat sink elements, and a plurality of fastening regions for maintaining the position of the spring element relative to the outer surface of the heat sink element with which it is in contact. In an embodiment, at least one force application region is provided for each of the at least one heat-generating components. In an embodiment, the compressive forces applied by each of the spring elements are at a maximum in the at least one force application region.

In an embodiment, the heat exchanger assembly includes a plurality of said heat-generating electronic components aligned along a longitudinal axis of the heat sink elements, and wherein each of the spring elements includes a plurality of said force application regions.

In an embodiment, the force application regions are located such that at least some of the force application regions are positioned approximately centrally above or below a side surface of one of the heat-generating electronic components.

In an embodiment, at least some of the force application regions are located approximately in the middle of one of the spring elements, along a widthwise dimension of the spring element, transverse to the longitudinal axis.

In an embodiment, the force application regions are spaced apart along the longitudinal axis by a center-to-center distance between adjacent heat-generating electronic components.

In an embodiment, the fastening regions are located at outer edges of each said spring element, and are located outwardly beyond the peripheral edges of the heat sink elements.

In an embodiment, the fastening regions in the respective spring elements are arranged so as to be vertically aligned with one another.

In an embodiment, the fastening regions are provided with fastening means for receiving fasteners by which the spring elements are joined together. In an embodiment, the fastening means are slots or holes, and wherein the fasteners comprise rods, screws or bolts.

In an embodiment, each of the spring elements comprises a plurality of X-shaped members, each of which comprises a pair of criss-crossing leg members arranged diagonally relative to a longitudinal axis of the heat sink elements. In an embodiment, the leg members have opposite ends at which the fastening regions are located and at which adjacent X-shaped members of the spring element are joined together.

In an embodiment, at least some of the force application regions are located at points at which the leg members of each of the X-shaped members cross one another.

In an embodiment, each of the spring elements is non-planar in its uncompressed state, with the force application regions being generally located in one or more planes spaced apart from a plane in which the fastening regions are generally located, and the leg members are generally inclined as they extend between the force application regions and the fastening regions.

In an embodiment, each of the force application regions is defined by a bend formed in the spring element. In an embodiment, each of the bends is parallel to the longitudinal axis. In an embodiment, the bends face in the same direction so as to provide the spring element with an overall convex shape in a transverse dimension perpendicular to the longitudinal axis, with the spring element in an uncompressed state, and wherein the spring element is installed on the heat sink element with the convex shape facing toward the heat sink element.

In an embodiment, each of the spring elements includes:
a plurality of inner force application regions aligned along the longitudinal axis;
a plurality of outer force application regions, each of the outer force application regions being located proximate to one of the fastening regions; and
a plurality of intermediate force application regions, each of the intermediate force application regions being located along one of the leg members between one of the inner force application regions and one of the outer force application regions.

In an embodiment, the heat exchanger assembly further comprises heat sink plates fixed to the outer surfaces of the first and second heat sink elements, wherein each of the heat sink plates includes grooves in which the leg members of the spring elements are received.

In an embodiment, each of the spring elements is integrally formed from a sheet or plate of spring steel and is of uniform thickness throughout.

In an embodiment, the heat sink elements are connected in series arrangement with an inlet opening provided in the first heat sink element and an outlet opening provided in the second heat sink element, wherein the inlet and outlet openings are arranged side-by-side at a first end of the heat exchanger assembly, and wherein the inlet and outlet openings are provided with fittings which are arranged side-by-side and project in the same direction. In an embodiment, the first and second heat sink elements are each formed with bulge portions in which the respective inlet and outlet openings are located; wherein each said bulge portion extends widthwise across a portion of the respective heat sink element from approximately the longitudinal axis to an outer, longitudinally extending peripheral edge of the heat sink element.

BRIEF DESCRIPTION OF DRAWINGS

The invention will now be described, by way of example only, with reference to the accompanying drawings in which.

DETAILED DESCRIPTION

A heat exchanger assembly 10 according to an example embodiment is described below with reference to FIGS. 1 to 5.

Heat exchanger assembly 10 comprises a first heat sink element 12 (the upper portion in the drawings) and a second heat sink element 14 (the lower portion in the drawings). The two heat sink elements 12, 14 are separated by a space 16 in which at least one heat-generating electronic component 18 is located, with the at least one heat-generating electronic component 18 being sandwiched between the first and second heat sink elements 12, 14. In the present embodiment the space 16 contains a plurality of heat-generating electronic components 18. The electronic components 18 may comprise IGBTs.

The first heat sink element 12 of heat exchanger assembly 10 has a hollow interior which defines a first fluid flow passage 20. In the present embodiment, the first heat sink element 12 comprises a first plate pair 26 comprising a pair of plates 28, 30 sealed together at their peripheral edges. The first plate 28 is flat and planar, and the second plate 30 is shaped with a flat, planar plate bottom and a raised peripheral flange 32 with a peripheral sealing surface 34 along which the second plate 30 is sealingly joined to the first plate 28, for example by brazing or welding.

The second heat sink element 14 of heat exchanger assembly 10 similarly has a hollow interior which defines a second fluid flow passage 36. In the present embodiment, the second heat sink element 14 comprises a second plate pair 42 comprising a pair of plates 44, 46 sealed together at their peripheral edges. The first plate 44 is flat and planar, and the second plate 46 is shaped with a flat, planar plate bottom and a raised peripheral flange 48 with a peripheral sealing surface 50 along which the second plate 46 is sealingly joined to the first plate 44, for example by brazing or welding.

The first and second heat sink elements 12, 14 and the respective first and second flow passages 20, 36 may be parallel to one another. In addition, heat exchanger assembly 10 has a central longitudinal axis A (FIGS. 2 and 3) which is parallel to a long dimension of the heat sink elements 12, 14 and to the directions of fluid flow through the first and second flow passages 20, 36. The heat sink elements 12, 14 are elongate and the flow passages 20, 36 extend from one end of the heat sink elements 12, 14 to the other end thereof.

Although not essential to the invention, the heat exchanger plates 28, 30, 44, 46 may be comprised of aluminum or an aluminum alloy.

The first plate 28, 44 of each heat sink element 12, 14 is flat and planar, and comprises a heat sink plate. Each of the heat sink plates 28, 44 has a thickness significantly greater than that of the second plates 30, 46. It will be appreciated that the heat exchanger assembly 10 may instead be constructed with plate pairs made from relatively thin plates, and with separate heat sink plates which are fixed to the outer surface of one of the plates of each plate pair by brazing or welding.

The heat-generating electronic components 18 are sandwiched between the heat sink elements 12, 14. The heat-generating electronic components 18 may generally be in the shape of rectangular prisms, each having a pair of opposite major side surfaces, namely a first side surface 22 and a second side surface 24. The first and second side surfaces 22, 24 are flat, planar, and parallel to the heat sink elements 12, 14. The first side surface 22 of each heat-generating electronic component 18 is in thermal contact with the first plate 28 of the first heat sink element 12, wherein the surface of first plate 28 in thermal contact with the first side surfaces 22 of the heat-generating electronic components 18 is sometimes referred to herein as the inner surface of the first heat sink element 12, and is identified by reference numeral 27 in FIGS. 4 and 5. The opposite surface of first heat sink element 12 is sometimes referred to herein as the outer surface of the first heat sink element 12 and is identified by reference numeral 29 in FIGS. 4 and 5.

Figure 4:
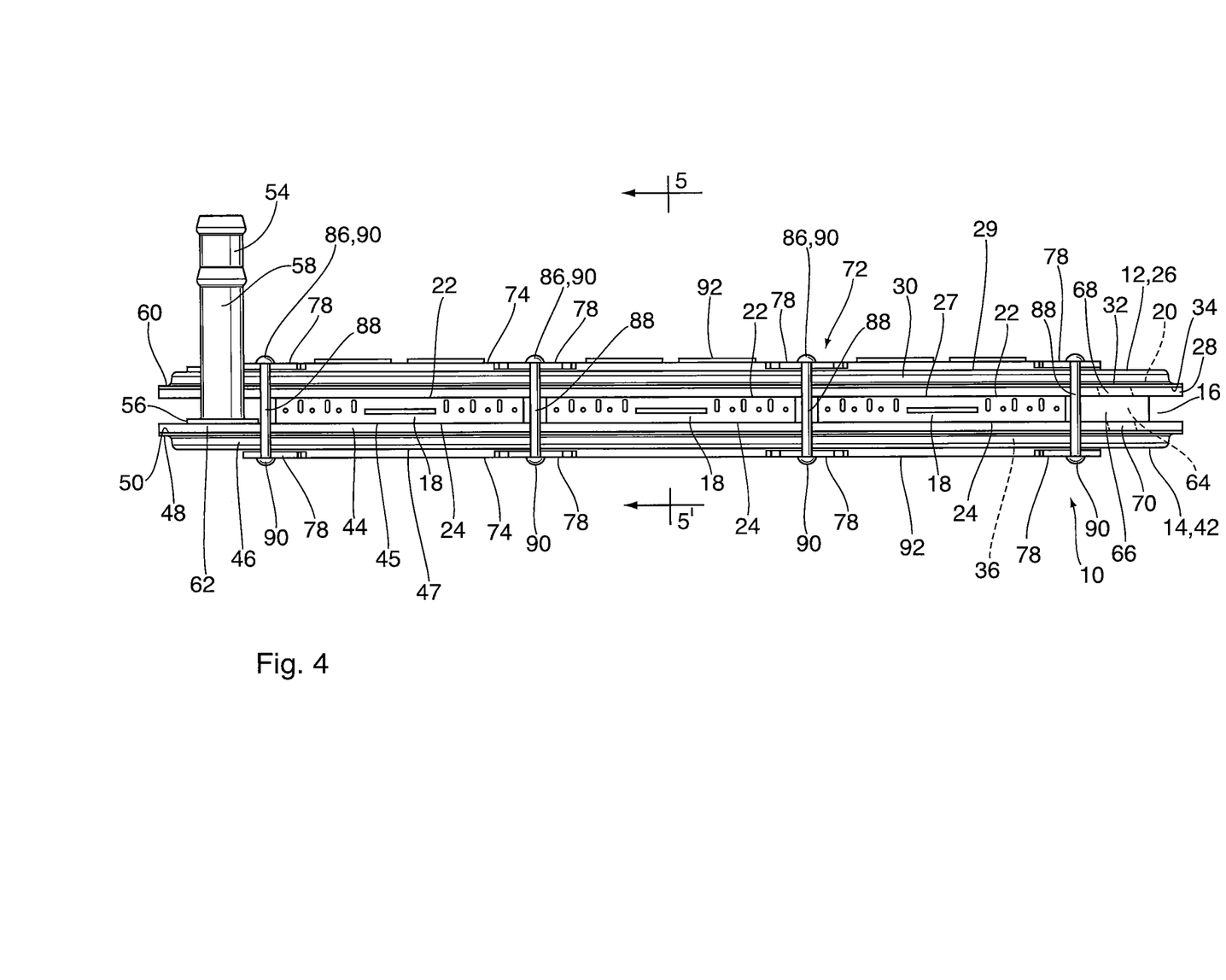
FIG. 4 is a side elevation view of the heat exchanger of FIG. 1.
Figure 5:
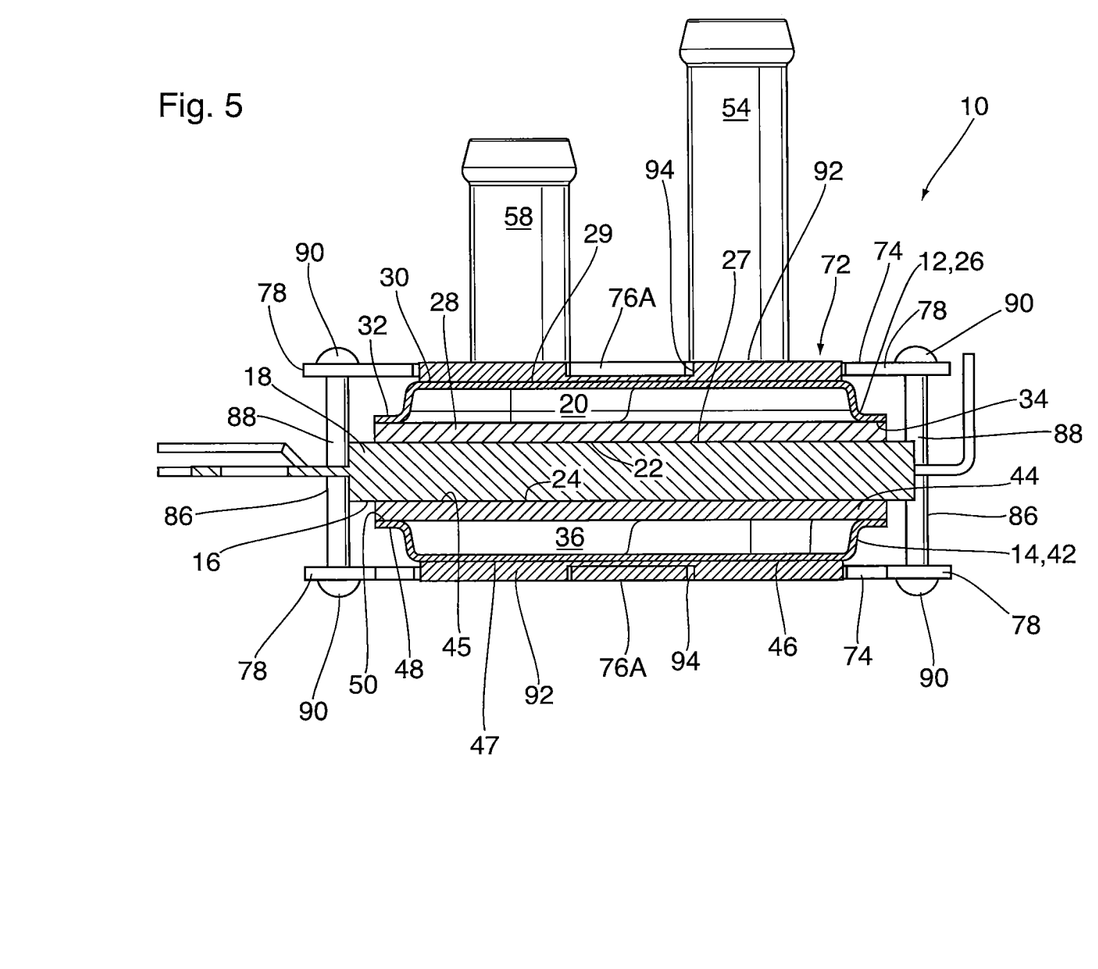
FIG. 5 is a cross-section along line 5-5' of FIG. 4.
Figure 6:
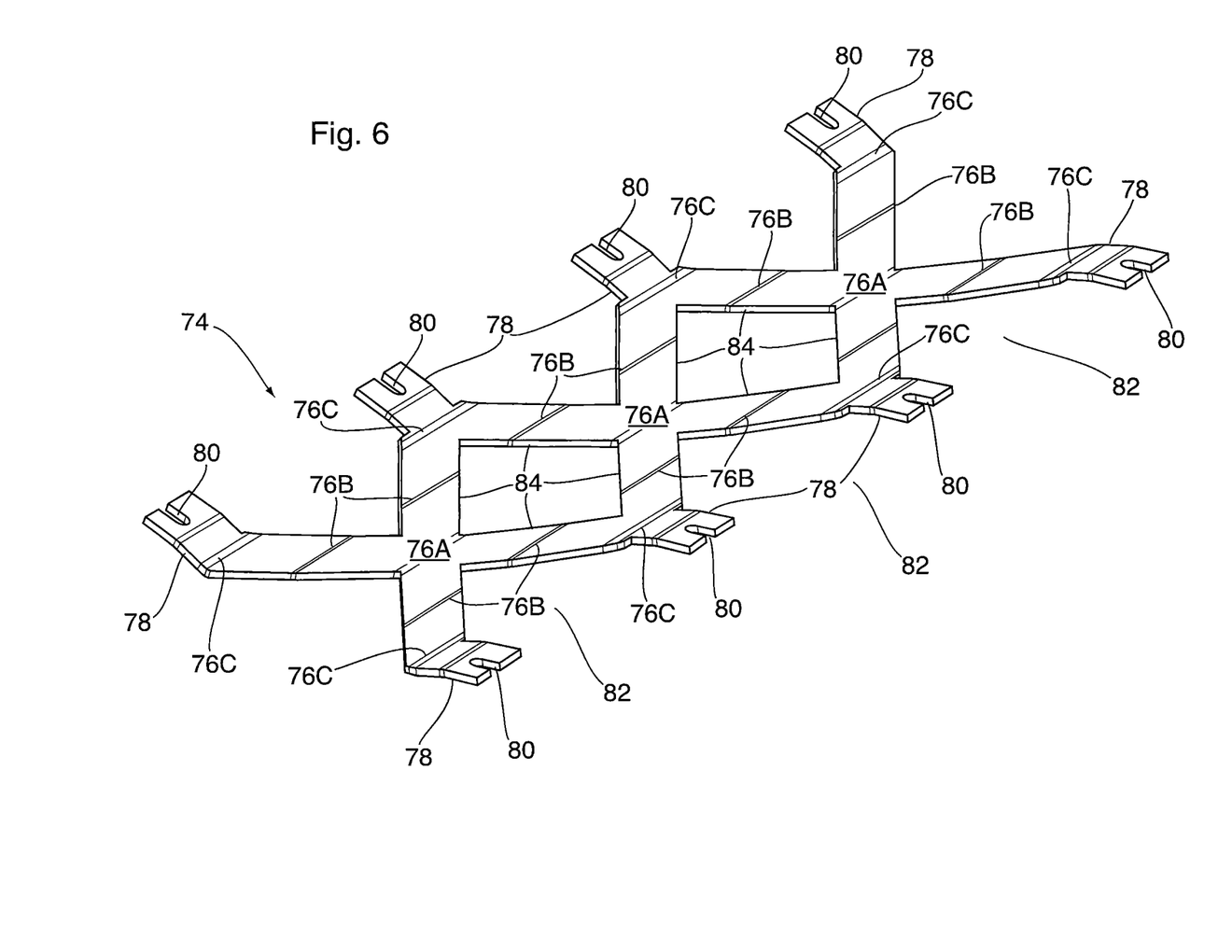
FIG. 6 is a top perspective view showing the spring plate of the heat exchanger of FIG. 1.

The second side surface 24 of each heat-generating electronic component 18 is in thermal contact with the first plate 44 of the second heat sink element 14, wherein the surface of first plate 44 in thermal contact with the second side surfaces 24 of the heat-generating electronic components 18 is sometimes referred to herein as the inner surface of the second heat sink element 14, and is identified by reference numeral 45 in FIGS. 4 and 5. The opposite surface of second heat sink element 14 is sometimes referred to herein as the outer surface of the second heat sink element 14 and is identified by reference numeral 47 in FIGS. 4 and 5.

The first and second side surfaces 22, 24 of the heat-generating electronic components 18 are shown in the drawings as being substantially square, having a width dimension approximately the same as the widths of the heat sink elements 12, 14 transverse to longitudinal axis A.

The heat exchanger assembly 10 includes three heat-generating electronic components 18 which are aligned in a single row along the longitudinal axis A and spaced apart from one another. Heat emitted by the electronic components 18 is transferred through the first plates 28, 44 of respective heat sink elements 12, 14 to the coolant circulating in first and second flow passages 20, 36. It will be appreciated that the heat exchanger assembly 10 may comprise more or fewer than three heat-generating electronic components 18, and may be arranged in multiple rows, and that heat sink elements 12, 14 of increased or decreased length and/or width may be provided, depending on the number, dimensions and arrangement of the heat-generating electronic components 18.

The first and second flow passages 20, 36 of heat exchanger assembly 10 are connected in series such that the coolant first flows through one of the flow passages 20, 36 and then through the other of the flow passages 20, 36. In the illustrated embodiment, the coolant flows through the first fluid flow passage 20 and then through the second fluid flow passage 36 to cool the opposite side surfaces 22, 24 of the heat-generating electronic components 18. Accordingly, the first heat sink element 12 comprising first plate pair 26 is provided with an inlet opening 52 and an associated inlet fitting 54, while the second heat sink element 14 comprising second plate pair 42 is provided with an outlet opening 56 and an associated outlet fitting 58. Although the heat exchanger assembly 10 is shown as having a series flow configuration, it will be appreciated that the heat exchanger assembly 10 may be configured for parallel flow of coolant through the first and second heat sink elements 12, 14. For example, similar to the arrangement shown in above-mentioned U.S. Pat. No. 7,295,433, each heat sink element 12, 14 may be provided with its own inlet and outlet openings and fittings which are all connected to a coolant circulation system. Alternatively, the heat sink elements 12, 14 may be connected together by an inlet manifold and an outlet manifold, such that only one inlet opening and one outlet opening are required.

The locations of openings 52, 56 and fittings 54, 58 will vary from one application to another. In the present embodiment, inlet and outlet openings 52, 56 are located side-by-side at the same end of the heat exchanger assembly 10, with the respective inlet and outlet fittings 54, 58 extending in the same direction, at right angles to the planes in which the heat sink elements 12, 14 are located. Accordingly, the inlet opening 52 and inlet fitting 54 are provided in the second plate 30 of the first heat sink element 12 and the outlet opening 56 and outlet fitting 58 are provided in the first plate 44 of the second heat sink element 14. In an alternate series arrangement, a single co-axial inlet/outlet fitting may be provided, for example as disclosed in US 2014/0224452 A1 by Abels.

To conveniently allow for side-by-side arrangement of the inlet and outlet openings 52, 56 and their associated fittings 54, 58, the respective plates 28, 30, 44, 46 and heat sink elements 12, 14 are formed with bulge portions 60, 62, wherein the inlet opening 52 and inlet fitting 54 are located in the inlet bulge portion 60 and the outlet opening 56 and outlet fitting 58 being located in the outlet bulge portion 62. The bulge portions 60, 62 each extend widthwise across a portion of the respective heat sink elements 12, 14, i.e. from approximately the middle (close to central axis A) to an outer, longitudinally extending peripheral edge of the heat sink element 12 or 14, and do not extend outwardly beyond the longitudinal edges of the heat sink elements 12, 14. It will be appreciated, however, that the bulge portions 60, 62 are in flow communication with the entire widths of fluid flow passages 20, 36.

Figure 1:
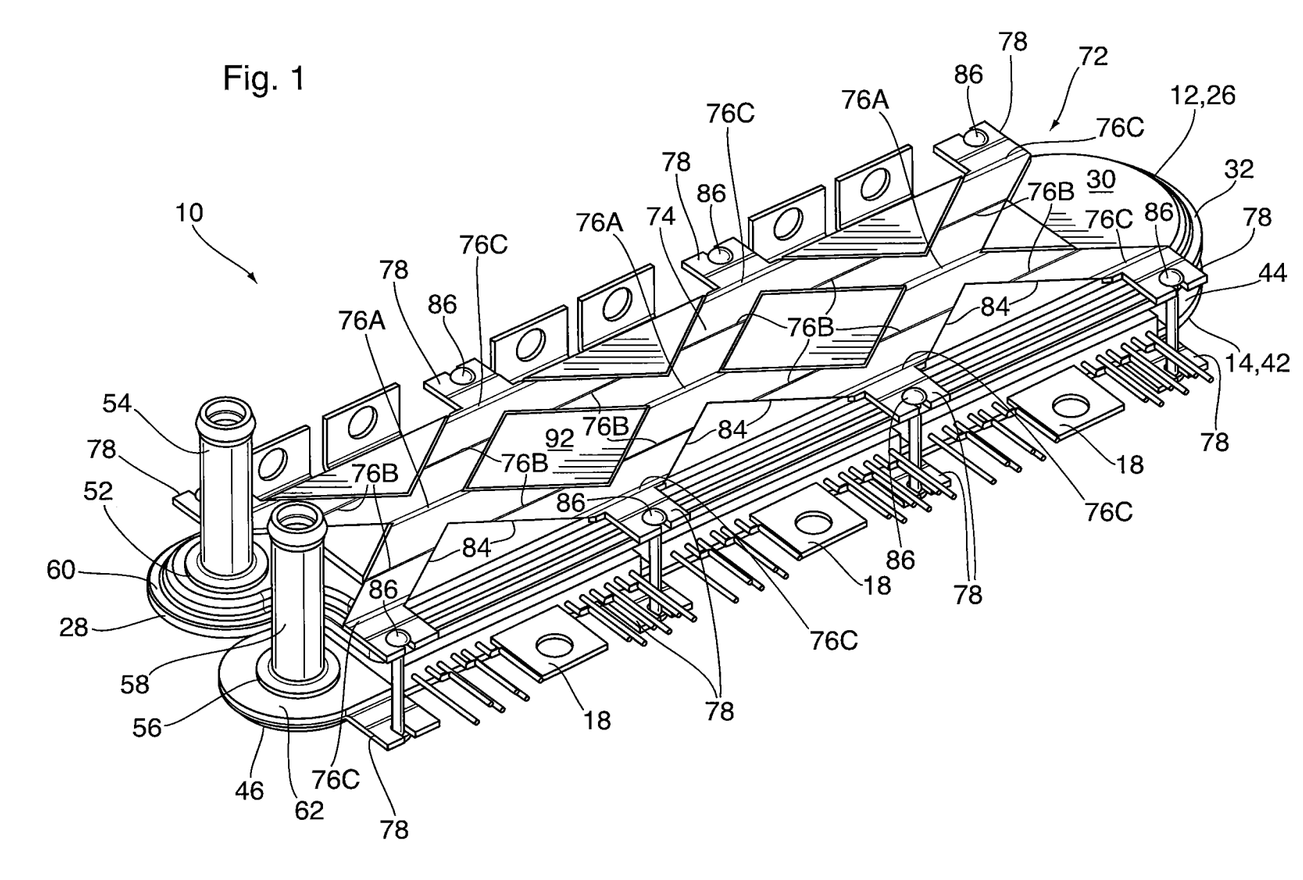
FIG. 1 is a top perspective view of a heat exchanger according to an embodiment.
Figure 2:
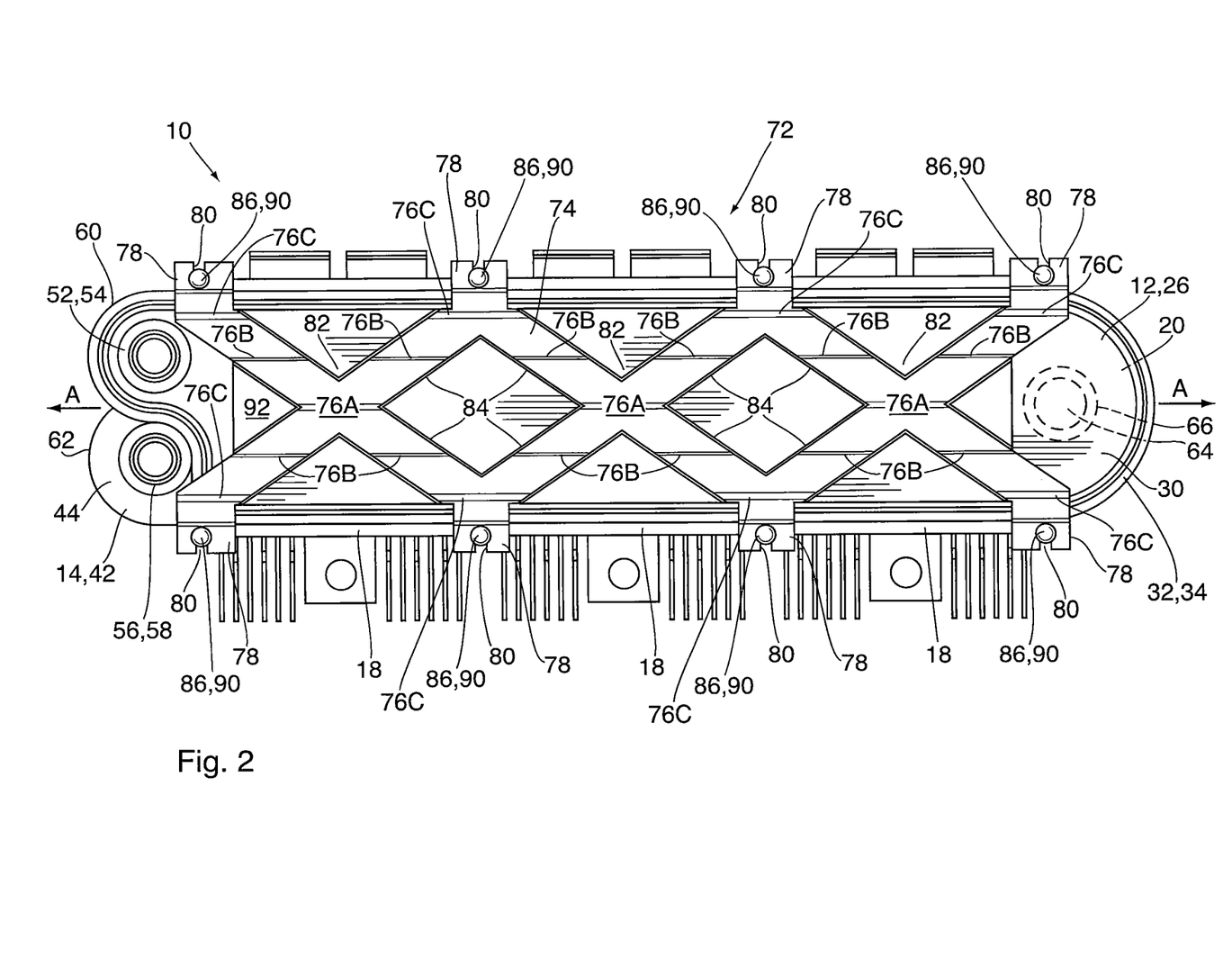
FIG. 2 is a top plan view of the heat exchanger of FIG. 1.
Figure 3:
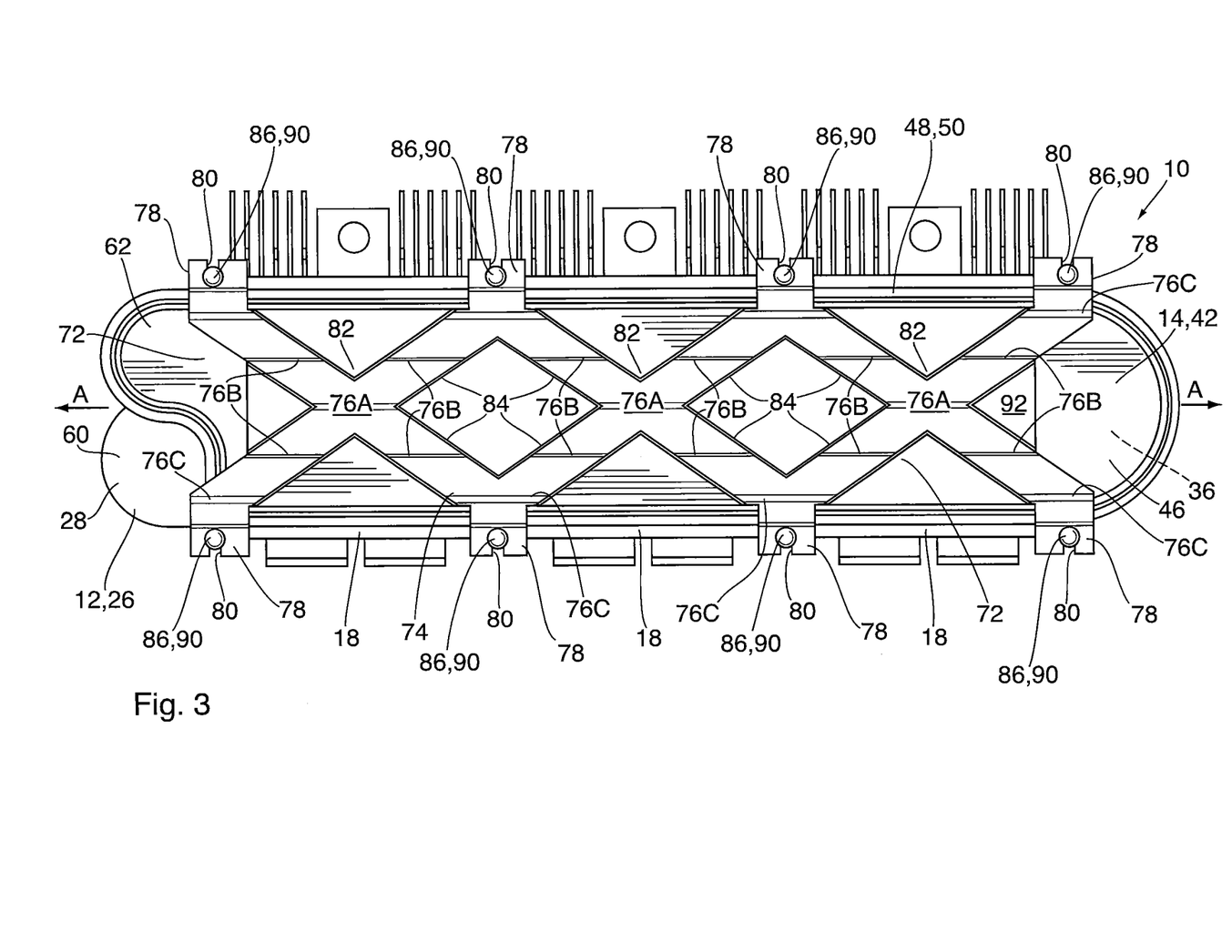
FIG. 3 is bottom plan view of the heat exchanger of FIG. 1.

At the end of heat exchanger 10 assembly opposite to openings 52, 56, fittings 54, 58 and bulge portions 60, 62, a turnaround passage 64 is provided through which the coolant exits the first fluid flow passage 20 and enters the second fluid flow passage 36. As shown in FIGS. 2 and 4, the turnaround passage 64 is defined by a spacer element 66 having a sidewall and a hollow interior, the spacer element 66 being in sealed flow communication with, and extending between, a communication opening 68 provided in the first plate 28 of the first heat sink element 12 and a communication opening 70 provided in the second plate 30 of the second heat sink element 14.

As can be seen in the side view of FIG. 4, the turnaround passage 64 and spacer 66 are located proximate to the ends of the heat sink elements 12, 14, such that the heat-generating electronic components 18 are located between the turnaround passage 64 and the bulge portions 60, 62 in which the inlet and outlet openings 52, 56 are provided. Thus, coolant entering the heat exchanger assembly 10 through inlet opening 52 and inlet fitting 54 flows through the first fluid flow passage 20 along the first side surfaces 22 of the heat-generating components 18, then flows through the turnaround passage 64 to enter the second fluid flow passage 36. The coolant then flows through the second fluid flow passage 36 along the second side surfaces 24 of the heat-generating components 18 and is discharged from the heat exchanger assembly 10 through the outlet opening 56 and outlet fitting 58. In this way, cooling is achieved along both side surfaces 22, 24 of each heat-generating component 18.

Although not shown in the drawings, the first and second flow passages 20, 36 may be provided with turbulence-enhancing inserts, each of which may comprise a fin or a turbulizer. In addition to increasing turbulence, these inserts also enlarge the area of the heat transfer surfaces which are in contact with the coolant flowing through the first and second flow passages 20, 36. As used herein, the terms "fin" and "turbulizer" are intended to refer to corrugated turbulence-enhancing inserts having a plurality of axially-extending ridges or crests connected by side walls, with the ridges being rounded or flat. As defined herein, a "fin" has continuous ridges whereas a "turbulizer" has ridges which are interrupted along their length, so that axial flow through the turbulizer is tortuous. Turbulizers are sometimes referred to as offset or lanced strip fins, and example of such turbulizers are described in U.S. Pat. No. Re. 35,890 (So) and U.S. Pat. No. 6,273,183 (So et al.). The patents to So and So et al. are incorporated herein by reference in their entireties.

Thermal contact between heat sink elements 12, 14 and heat-generating components 18 may be enhanced by providing a thin layer of a thermal interface material (TIM) at the interface between the inner surface 27 of first heat sink element 12 (first plate 28 of first plate pair 26) and the first side surfaces 22 of the heat-generating components 18, and by providing a thin layer TIM at the interface between the inner surface 45 of the second heat sink element 14 (first plate 44 of second plate pair 42) and the second side surfaces 24 of the heat-generating components 18. The TIM may comprise a thermally conductive grease, wax or metallic material.

Thermal contact is enhanced by applying compression to the heat exchanger assembly 10 in order to bring the heat sink elements 12, 14 into intimate thermal contact with the heat-generating components 18. This is accomplished through the use of a clamping assembly 72 to apply compressive forces to the heat sink elements 12, 14.

The clamping assembly 72 comprises a pair of spring elements 74 which, in the present embodiment, are each integrally formed from a single piece of spring steel, for example by stamping and bending. A first one of the spring elements 74 is arranged in direct or indirect thermal contact with the outer surface 29 of the first heat sink element 12 while a second one of the spring elements 74 is arranged in direct or indirect thermal contact with the outer surface 47 of the second heat sink element 14. In the present embodiment the first and second spring elements 74 are identical to one another, although this is not essential.

Each spring element 74 comprises one or more discrete force application regions 76 for applying compressive force to one of the heat sink elements 12, 14, and a plurality of fastening regions 78 for maintaining the position of the spring element 74 relative to the heat sink elements 12, 14.

The spring elements 74 of the present embodiment each include a plurality of force application regions 76, with at least one such region 76 being provided for each of the heat-generating components 18. With the spring elements 74 attached to the heat exchanger assembly 10 and to one another as shown in the drawings, the first and second heat sink elements 12, 14 are sandwiched between the first and second spring elements 74, and compressive forces are applied to the heat sink elements 12, 14 by the spring elements 74. The compressive forces are at a maximum in the force application regions 76, to provide enhanced cooling of the heat-generating electronic components 18, as described further below.

The locations of the force application regions 76 in the spring elements 74 are selected such that compressive forces applied by spring elements 74 are focused or concentrated in areas of the heat-generating electronic components 18 in which heat tends to be concentrated, thereby providing enhanced cooling. For example, a plurality of inner force application regions 76A positioned approximately centrally above or below a side surface 22, 24 of one of the heat-generating components 18. The inner force application regions 76A are located to maximize compressive forces in the middles of the side surfaces 22, 24 of the heat-generating components 18, where heat may be concentrated. In the present embodiment, in the widthwise dimension shown in the end view of FIG. 9, the inner force application regions 76A are located approximately in the middle of spring element 74, and are substantially aligned to lie along the longitudinal axis A of the heat exchanger assembly 10. In the lengthwise dimension, the inner force application regions 76A are spaced apart by the center-to-center distance between adjacent heat-generating components 18.

Each of the spring elements 74 may include additional force application regions 76. For example, in the example embodiment, each of the spring elements 74 includes a pair of intermediate force application regions 76B and a pair of outer force application regions 76C. Each of the intermediate force application regions 76B is spaced about midway between the middle of spring element 74 and an outer edge thereof, so as to apply compressive forces to areas of the heat-generating components 18 located between the middles of the side surfaces 22, 24 and the outer edges thereof. Each of the outer force application regions 76C is spaced proximate to an outer edge of spring element 74, so as to apply compressive forces to areas of the heat-generating components 18 located proximate to the outer edges of the side surfaces 22, 24 thereof.

The fastening regions 78 are located at the outer edges of the spring elements 74, proximate to outer force application regions 76C, such that the fastening regions 78 extend outwardly beyond the peripheral edges of the heat sink elements 12, 14. The fastening regions 78 in the respective spring elements 74 are arranged so as to be vertically aligned with one another when the spring elements 74 are installed on heat exchanger assembly 10, as can be seen in FIG. 4. In addition, the fastening regions 78 are provided with means to permit the first and second spring elements 74 to be joined together so as to apply compressive forces to the first and second heat sink elements 12, 14, and thereby cause the heat-generating electronic components 18 to be clamped between the first and second heat sink elements 12, 14. In the present embodiment, the connection means for joining the first and second spring elements 74 are in the form of open-ended slots 80.

Each of the spring elements 74 in the present embodiment are configured as a plurality of X-shaped members 82, with three such members being provided in each spring element 74. Each X-shaped member 82 comprises a pair of criss-crossing leg members 84, each arranged diagonally relative to longitudinal axis A. The opposite ends of leg members 84 serve as the locations of the fastening regions 78 and/or as connection points to adjacent X-shaped members 82 within the same spring element 74. It can be seen from the drawings that the inner force application regions 76A are located at the crossing points of the leg members 84 in each of the X-shaped members 82. The intermediate force application regions 76B are located along leg members 84 between the crossing points and their opposite ends. The outer force application regions 76C are located at or proximate to the ends of the leg members 84.

Figure 7:
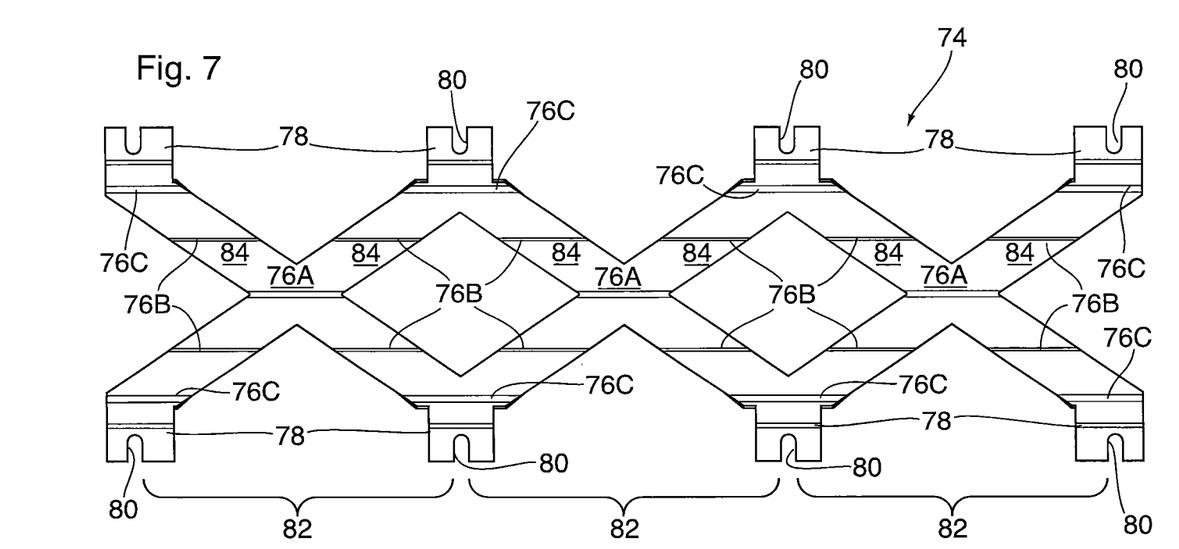
FIG. 7 is a top plan view of the spring plate of FIG. 6.
Figure 8:
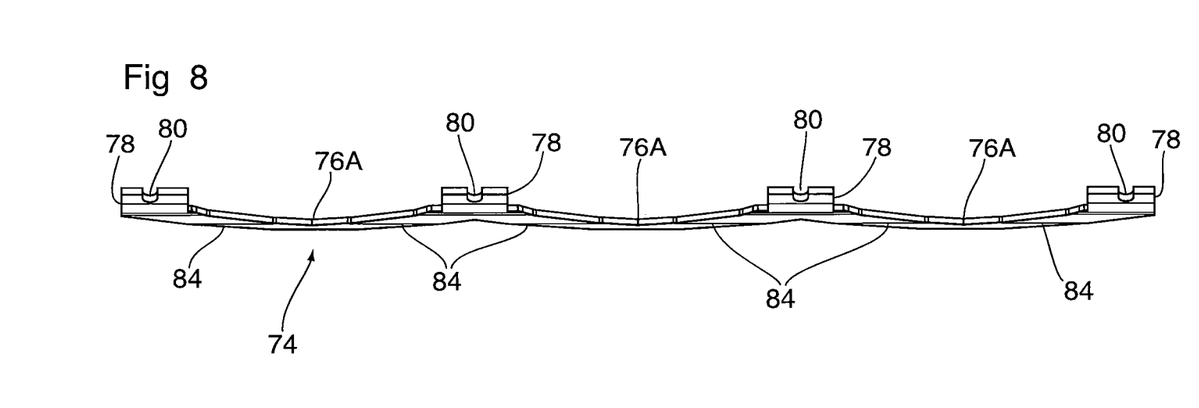
FIG. 8 is a side elevation view of the spring plate of FIG. 6.
Figure 9:
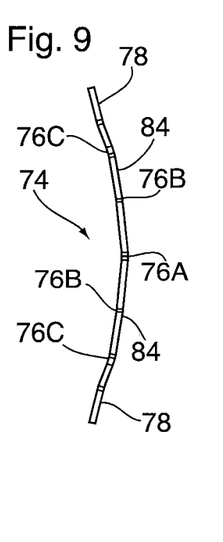
FIG. 9 is a front elevation view of the spring plate of FIG. 6

The spring elements 74 are each constructed so that the compressive forces applied to heat sink elements 12, 14 and to the heat-generating components 18 are at a maximum at the force application regions 76. In the present embodiment, as mentioned above, each of the spring elements 74 is integrally formed from a sheet or plate of spring steel, and is of uniform thickness throughout. In order to maximize the compressive forces at the force application regions 76, the spring elements 74 are formed by bending to be non-planar in their uncompressed state, as shown in FIGS. 7 to 9. More specifically, the spring elements 74 are formed such that the force-application regions 76 are generally located in one or more planes while the fastening regions 78 are generally located in another plane, the plane of the fastening regions 78 being spaced apart from the plane(s) of the fastening regions 76, and the leg members 84 are generally inclined as they extend from the force-application regions 76 to the fastening regions 78.

In the illustrated embodiment, each of the force application regions 76 is defined by a bend formed in the spring element 74, each of the bends being parallel to the longitudinal axis A. As shown in the end view of FIG. 9, the degree of bending may be the same or different in the different force application regions 76. In the present embodiment, the bends defining the outer force application regions 76C are more acute than the relatively shallow bends defining the inner and intermediate force application regions 76A and 766. The angles of the bends may be on the order of less than about 10 degrees, for example about 5 degrees.

As shown in FIG. 9, the bends all face in the same direction so as to provide the spring element 74 with an overall convex shape in a transverse dimension perpendicular to the longitudinal axis, with the spring element 74 in an uncompressed state as illustrated. When the spring element 74 is installed on one of the heat sink elements 12, 14, the convex shape faces toward the heat sink element 12, 14, and the concavity of the spring element 74 faces away from the heat sink element 12, 14.

Figure 10:
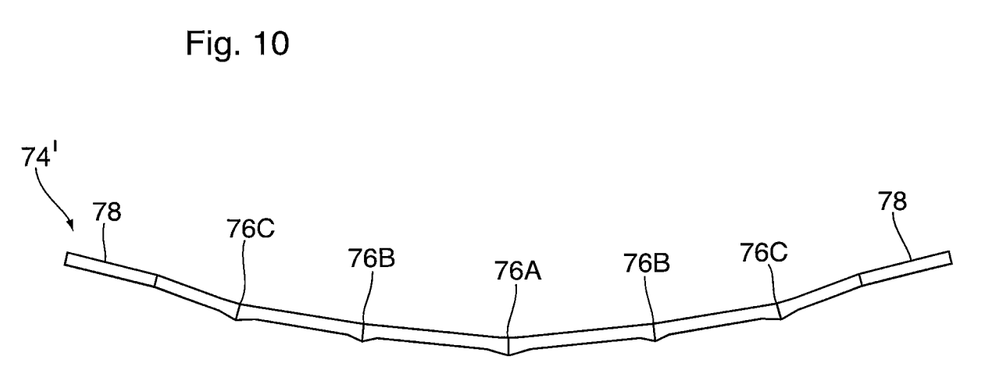
FIG. 10 is a front elevation view of a spring plate with an alternate configuration.

In alternate embodiments, the non-planar structure of the spring elements 74 may at least partly be achieved by thickening at least some of the force application regions 76 relative to other areas of the spring elements 74. For example, FIG. 10 shows a spring element 74' according to an alternate embodiment which is identical to spring element 74 except that each of the force application regions 76 is defined at least partly by local thickening of the spring element 74' in the regions of the force application regions 76. In addition, at least some of the force application regions 76 may be defined by bends as described above for spring element 74. For example, at least the thickened central force application area 76A of spring element 74' is also defined by a bend, as described above with reference to spring element 74.

The clamping assembly 72 further comprises a plurality of fastening elements 86. In the present embodiment each of the fastening elements 86 comprises a rod having a shaft 88 and with an expanded head 90 provided at each end. The shaft 88 has a diameter such that it can be slid into one of the open-ended slots 80. The clamping assembly 72 is assembled on heat exchanger assembly 10 by compressing the spring elements 74 over the plate pairs 26, 42 using a press, and then inserting the fastening elements 86 into the slots 80, and then releasing the press.

Rather than shafts 88 with expanded heads 90, the fastening elements 86 may comprise threaded rods, bolts or screws, and the slots 80 may be replaced by holes which are closed about their edges.

As mentioned above, the first and second spring elements 74 are arranged in direct or indirect contact with the outer surfaces 29, 47 of the first and second heat sink elements 12, 14. In the embodiment illustrated in FIGS. 1 to 5, the heat exchanger assembly 10 includes outer heat sink plates 92 which are directly fixed to, and in thermal contact with, the outer surfaces 29, 47 of the heat sink elements 12, 14. These outer heat sink plates 92 may be provided, for example, for thermal contact with additional heat-generating electronic components (not shown) arranged along the outer surfaces 29, 47 of the heat sink elements 12, 14. In the embodiment illustrated in FIGS. 11 and 12, the heat exchanger assembly 10 does not include outer heat sink plates 92 and the spring elements 74 are in direct contact with the outer surfaces 29, 47 of the first and second heat sink elements 12, 14.

The outer heat sink plates 92 include grooves 94 (FIG. 5) for accepting the leg members 84 of the spring elements 74, such that the top surface of each spring member 74 will be substantially co-planar with, or slightly recessed, relative to the outer surface of one of the outer heat sink plates 92. These grooves 94 extend through a portion of the thickness of the outer heat sink plates 92. This can be seen in FIGS. 4 and 5. This arrangement ensures that the outer surfaces of the outer heat sink plates 92 will be in thermal contact with the additional heat-generating components arranged along the outer surfaces 29, 47 of the heat sink elements 12, 14.

The structure of the outer heat sink plates 92 may also assist in locating and retaining the spring elements 74 relative to heat sink elements 12, 14, due to the fact that the leg members 84 of the spring elements 74 are received in the grooves 94 of the outer heat sink plates 92.

It will be appreciated that the outer heat sink plates 92 are not essential components of the heat exchanger assembly 10, and that the spring elements 74 may be in direct contact with the outer surfaces 29, 47 of the heat sink elements 12, 14.

Figure 11:
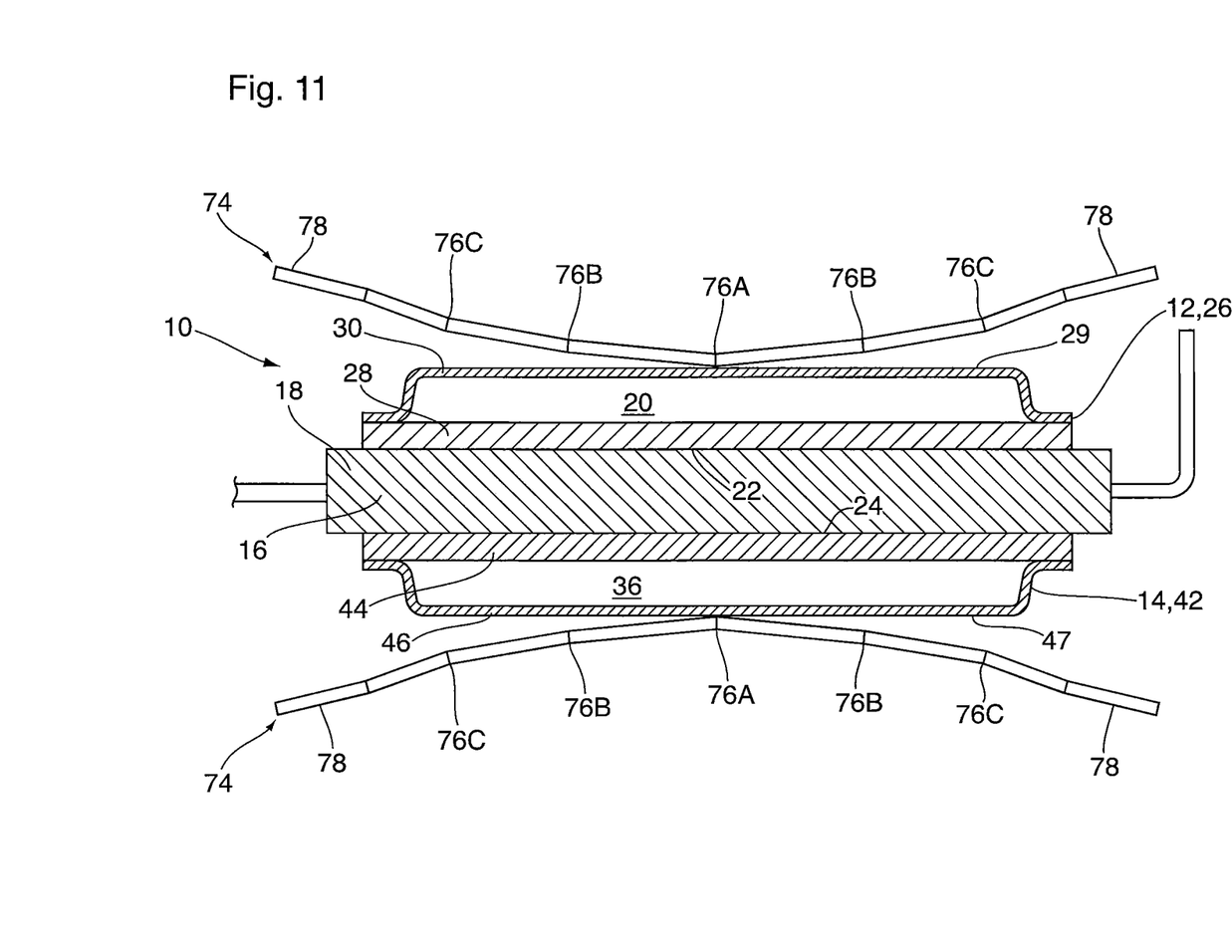
FIG. 11 is a cross-section similar to FIG. 5, showing the spring plate prior to the application of clamping forces.
Figure 12:
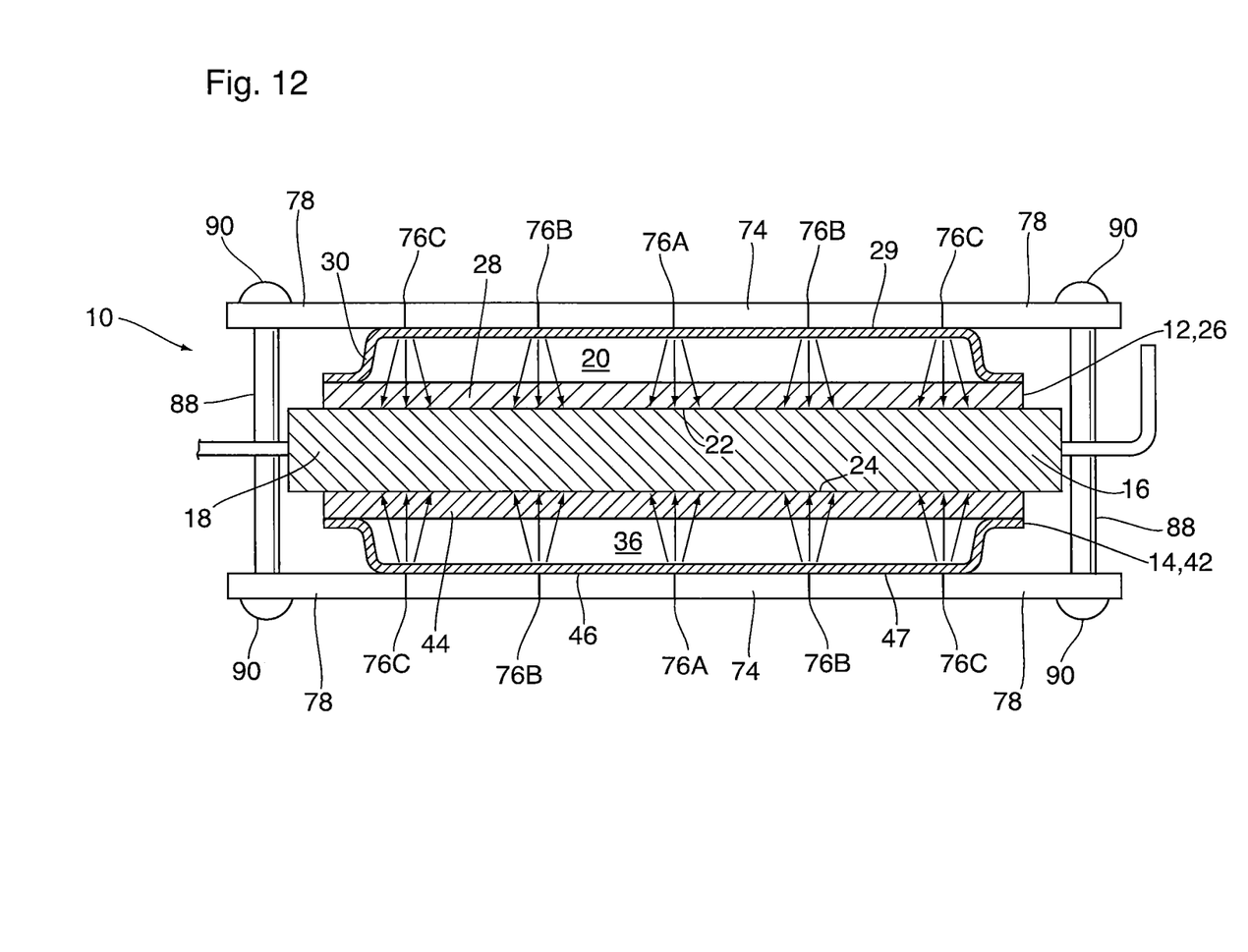
FIG. 12 is a cross-section similar to FIG. 5, showing the spring plate after the application of clamping forces.

FIGS. 11 and 12 are provided to show the positioning of the spring elements 74 relative to the other components of heat exchanger assembly 10 before and after they are compressed into contact with the first and second heat sink elements 12, 14.

With the spring elements 74 installed on heat exchanger assembly 10 as shown in FIGS. 4, 5 and 12, the spring elements 74 may have a substantially flat, planar appearance as shown in FIGS. 4 and 5, such that portions of the spring elements 74 outside the force application regions 76 may appear to be in contact with the outer surfaces 29, 47 of the first and second heat sink elements 12, 14. However, it will be appreciated that the benefits of the clamping assembly 72 do not rely on thermal contact between the heat sink elements 12, 14 and portions of the spring elements 74 located outside the force application regions 76, and therefore the spring elements 74 may deviate somewhat from a planar configuration when installed on the heat exchanger assembly 10. Furthermore, even where the spring elements 74 have a substantially planar appearance as in FIGS. 4 and 5, it will be appreciated the compressive forces will be concentrated at the force application regions 76. It will be appreciated that selective application of compressive forces in vertical alignment with areas of the heat-generating electronic components requiring cooling will provide more effective thermal contact between the heat sink elements 12, 14 and the heat-generating electronic components 18 than conventional perimeter clamping, where the clamping forces may be located outside the area of the heat-generating electronic components 18. The compressive forces exerted by the spring elements 74 on the heat-generating electronic components 18, through the heat sink elements 12, 14, are represented by arrows in FIG. 12. It can be seen that the compressive forces applied by the spring elements 74 are applied at multiple points between the edges of the heat-generating electronic components 18, and may be distributed across the surface area of the heat-generating electronic components 18.

It will be appreciated that the compression provided by clamping assembly 72 will improve the thermal contact between the heat sink elements 12, 14 across the surface area of the heat-generating components 18, and the compression may be sufficiently high so as to squeeze some of the TIM from the interface area between the heat sink elements 12, 14 and the heat-generating electronic components 18, such that the TIM will still eliminate any voids between the heat sink elements 12, 14 and the heat-generating electronic components 18, while being sufficiently thin in other areas so as to minimize the insulating effect of the TIM.

Although the invention has been described in connection with certain embodiments, it is not restricted thereto. Rather, the invention includes all embodiments which may fall within the scope of the following claims.

What is claimed is:

1. A heat exchanger assembly comprising:
a first heat sink element and a second heat sink element separated by a space, wherein the first heat sink element defines a first fluid flow passage and the second heat sink element defines a second fluid flow passage, and wherein the first and second heat sink elements are parallel to one another;
at least one heat-generating electronic component located in said space and sandwiched between the first and second heat sink elements, wherein each said heat-generating electronic component has a first side surface in thermal contact with an inner surface of the first heat sink element and an opposite side surface in thermal contact with the inner surface of the second heat sink element; and
a clamping assembly, comprising:
(a) a first spring element arranged in contact with an outer surface of the first heat sink element; and
(b) a second spring element arranged in contact with an outer surface of the second heat sink element;
wherein the first and second heat sink elements are sandwiched between the first and second spring elements, and wherein the first and second spring elements are joined together so as to apply compressive forces to the first and second heat sink elements and thereby cause the at least one heat-generating electronic component to be clamped between the first and second heat sink elements;
wherein each said spring element comprises one or more discrete force application regions for applying force to one of the heat sink elements, and a plurality of fastening regions for maintaining the position of the spring element relative to the outer surface of the heat sink element with which it is in contact;
wherein the force application regions are located such that at least some of the force application regions are positioned approximately centrally above or below a side surface of one of the heat-generating electronic components; and
wherein the force application regions are spaced apart along the longitudinal axis by a center-to-center distance between adjacent heat-generating electronic components.

2. The heat exchanger assembly of claim 1, wherein at least one force application region is provided for each of the at least one heat-generating components.

3. The heat exchanger assembly of claim 1, wherein the compressive forces applied by each of the spring elements are at a maximum in the at least one force application region.

4. The heat exchanger assembly of claim 1, wherein the heat exchanger assembly includes a plurality of said heat-generating electronic components aligned along a longitudinal axis of the heat sink elements, and wherein each of the spring elements includes a plurality of said force application regions.

5. The heat exchanger assembly of claim 1, wherein at least some of the force application regions are located approximately in the middle of one of the spring elements, along a widthwise dimension of the spring element, transverse to the longitudinal axis.

6. The heat exchanger assembly of claim 1, wherein the fastening regions are located at outer edges of each said spring element, and are located outwardly beyond the peripheral edges of the heat sink elements.

7. The heat exchanger assembly of claim 6, wherein the fastening regions in the respective spring elements are arranged so as to be vertically aligned with one another.

8. The heat exchanger assembly of claim 1, wherein each of the spring elements is integrally formed from a sheet or plate of spring steel and is of uniform thickness throughout.

9. The heat exchanger assembly of claim 1, wherein each of the spring elements comprises a plurality of X-shaped members, each of which comprises a pair of criss-crossing leg members arranged diagonally relative to a longitudinal axis of the heat sink elements.

10. The heat exchanger assembly of claim 9, wherein each of the force application regions is defined by a local thickening of the spring element in the force application region, and optionally wherein one or more of the force application regions is defined by a bend formed in the spring element.

11. The heat exchanger assembly of claim 9, wherein each of the spring elements includes:
a plurality of inner force application regions aligned along the longitudinal axis;
a plurality of outer force application regions, each of the outer force application regions being located proximate to one of the fastening regions; and
a plurality of intermediate force application regions, each of the intermediate force application regions being located along one of the leg members between one of the inner force application regions and one of the outer force application regions.

12. The heat exchanger assembly of claim 9, further comprising heat sink plates fixed to the outer surfaces of the first and second heat sink elements, wherein each of the heat sink plates includes grooves in which the leg members of the spring elements are received.

13. The heat exchanger assembly of claim 9, wherein the leg members have opposite ends at which the fastening regions are located and at which adjacent X-shaped members of the spring element are joined together.

14. The heat exchanger assembly of claim 9, wherein at least some of the force application regions are located at points at which the leg members of each of the X-shaped members cross one another.

15. The heat exchanger assembly of claim 14, wherein each of the spring elements is non-planar in its uncompressed state, with the force application regions being generally located in one of more planes spaced apart from a plane in which the fastening regions are generally located, and the leg members are generally inclined as they extend between the force application regions and the fastening regions.

16. The heat exchanger assembly of claim 9, wherein each of the force application regions is defined by a bend formed in the spring element.

17. The heat exchanger assembly of claim 16, wherein each of the bends is parallel to the longitudinal axis.

18. The heat exchanger assembly of claim 16, wherein the bends face in the same direction so as to provide the spring element with an overall convex shape in a transverse dimension perpendicular to the longitudinal axis, with the spring element in an uncompressed state, and wherein the spring element is installed on the heat sink element with the convex shape facing toward the heat sink element.

19. The A heat exchanger assembly comprising:
a first heat sink element and a second heat sink element separated by a space, wherein the first heat sink element defines a first fluid flow passage and the second heat sink element defines a second fluid flow passage, and wherein the first and second heat sink elements are parallel to one another;
at least one heat-generating electronic component located in said space and sandwiched between the first and second heat sink elements, wherein each said heat-generating electronic component has a first side surface in thermal contact with an inner surface of the first heat sink element and an opposite side surface in thermal contact with the inner surface of the second heat sink element; and
a clamping assembly, comprising:
(a) a first spring element arranged in contact with an outer surface of the first heat sink element; and
(b) a second spring element arranged in contact with an outer surface of the second heat sink element;
wherein the first and second heat sink elements are sandwiched between the first and second spring elements, and wherein the first and second spring elements are joined together so as to apply compressive forces to the first and second heat sink elements and thereby cause the at least one heat-generating electronic component to be clamped between the first and second heat sink elements;
wherein each said spring element comprises one or more discrete force application regions for applying force to one of the heat sink elements, and a plurality of fastening regions for maintaining the position of the spring element relative to the outer surface of the heat sink element with which it is in contact;
wherein the fastening regions are located at outer edges of each said spring element, and are located outwardly beyond the peripheral edges of the heat sink elements; and
wherein the fastening regions are provided with fastening means for receiving fasteners by which the spring elements are joined together.

20. The heat exchanger assembly of claim 19, wherein the fastening means are slots or holes, and wherein the fasteners comprise rods, screws or bolts.

21. A heat exchanger assembly comprising:
a first heat sink element and a second heat sink element separated by a space, wherein the first heat sink element defines a first fluid flow passage and the second heat sink element defines a second fluid flow passage, and wherein the first and second heat sink elements are parallel to one another;
at least one heat-generating electronic component located in said space and sandwiched between the first and second heat sink elements, wherein each said heat-generating electronic component has a first side surface in thermal contact with an inner surface of the first heat sink element and an opposite side surface in thermal contact with the inner surface of the second heat sink element; and
a clamping assembly, comprising:
(a) a first spring element arranged in contact with an outer surface of the first heat sink element; and
(b) a second spring element arranged in contact with an outer surface of the second heat sink element;
wherein the first and second heat sink elements are sandwiched between the first and second spring elements, and wherein the first and second spring elements are joined together so as to apply compressive forces to the first and second heat sink elements and thereby cause the at least one heat-generating electronic component to be clamped between the first and second heat sink elements; and
wherein the heat sink elements are connected in series arrangement with an inlet opening provided in the first heat sink element and an outlet opening provided in the second heat sink element.

22. The heat exchanger assembly of claim 21, wherein the inlet and outlet openings are arranged side-by-side at a first end of the heat exchanger assembly, and wherein the inlet and outlet openings are provided with fittings which are arranged side-by-side and project in the same direction.

23. The heat exchanger assembly of claim 22, wherein the first and second heat sink elements are each formed with bulge portions in which the respective inlet and outlet openings are located; wherein each said bulge portion extends widthwise across a portion of the respective heat sink element from approximately the longitudinal axis to an outer, longitudinally extending peripheral edge of the heat sink element.

* * * * *